United States Patent
Son

(10) Patent No.: US 10,902,902 B2
(45) Date of Patent: Jan. 26, 2021

(54) MEMORY SYSTEM AND OPERATION METHOD OF MEMORY SYSTEM

(71) Applicant: SK hynix Inc., Gyeonggi-do (KR)

(72) Inventor: Mun-Gyu Son, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/669,212

(22) Filed: Oct. 30, 2019

(65) Prior Publication Data

US 2020/0066329 A1 Feb. 27, 2020

Related U.S. Application Data

(63) Continuation-in-part of application No. 15/984,858, filed on May 21, 2018, now Pat. No. 10,475,503.

(30) Foreign Application Priority Data

May 24, 2017 (KR) .................. 10-2017-0064168
Aug. 12, 2019 (KR) .................. 10-2019-0098019

(51) Int. Cl.
*G11C 11/40* (2006.01)
*G11C 11/406* (2006.01)
(Continued)

(52) U.S. Cl.
CPC ...... *G11C 11/40611* (2013.01); *G06F 3/0619* (2013.01); *G11C 11/408* (2013.01);
(Continued)

(58) Field of Classification Search
CPC ......... G11C 11/40611; G11C 11/40615; G11C 11/40622; G11C 11/408; G11C 11/4085; G11C 11/4087; G11C 29/42; G06F 3/0619
See application file for complete search history.

(56) References Cited

U.S. PATENT DOCUMENTS

| 6,535,966 B1 * | 3/2003 | Cherabuddi ........ G06F 12/0215 365/230.03 |
| 7,565,479 B2 * | 7/2009 | Best ...................... G11C 11/406 711/103 |
| 8,411,519 B2 * | 4/2013 | Byom .................... G11C 29/82 365/200 |

(Continued)

FOREIGN PATENT DOCUMENTS

| KR | 10-2014-0139848 | 12/2014 |
| KR | 10-2015-0072051 | 6/2015 |
| KR | 10-2016-0011015 | 1/2016 |

OTHER PUBLICATIONS

Son, M. et al., Making DRAM Stronger Against Row Hammering, 2017, 54th ACM/EDAC/IEEE Design Automation Conference (DAC), Jun. 18, 2017, IEEE, Austin, TX.

*Primary Examiner* — Vanthu T Nguyen
(74) *Attorney, Agent, or Firm* — IP & T Group LLP

(57) ABSTRACT

A memory system may include a memory system may include a memory device including a table suitable for managing rows for an additional refresh operation; and a memory controller comprising: a replica table corresponding to the table of the memory; an error history storage circuit suitable for storing an error history of the memory device; and a determination circuit suitable for determining whether to perform an active operation of a target row to be evicted from the replica table without the additional refresh operation, using the error history, when the target row is present.

18 Claims, 7 Drawing Sheets

(51) Int. Cl.
  *G06F 3/06* (2006.01)
  *G11C 11/408* (2006.01)
  *G11C 29/42* (2006.01)

(52) U.S. Cl.
  CPC .. *G11C 11/40615* (2013.01); *G11C 11/40622*
          (2013.01); *G11C 29/42* (2013.01)

(56) References Cited

U.S. PATENT DOCUMENTS

| | | | |
|---|---|---|---|
| 9,257,169 B2 * | 2/2016 | Jung | G11C 11/403 |
| 9,612,957 B2 * | 4/2017 | Brokhman | G06F 12/0246 |
| 9,690,505 B2 * | 6/2017 | Benedict | G06F 12/123 |
| 9,812,185 B2 * | 11/2017 | Fisch | G11C 29/06 |
| 2017/0263305 A1 * | 9/2017 | Cho | G11C 11/406 |
| 2018/0342281 A1 | 11/2018 | Yoo et al. | |

* cited by examiner

MEMORY SYSTEM AND OPERATION METHOD OF MEMORY SYSTEM

CROSS-REFERENCE TO RELATED APPLICATIONS

This application is a continuation-in-part of U.S. patent application Ser. No. 15/984,858, filed on May 21, 2018, which claims priority under 35 U.S.C. § 119 to Korean Patent Application No. 10-2017-0064168, filed on May 24, 2017, the content of both of which are incorporated herein by reference in their entirety. And this application also claims priority of Korean Patent Application No. 10-2019-0098019, filed on Aug. 12, 2019, which is incorporated herein by reference in its entirely.

BACKGROUND

1. Field

Various embodiments relate to a memory device.

2. Discussion of the Related Art

With an increase in the degree of integration of memories, the distance between adjacent word lines in a memory is gradually reduced. As this distance is reduced, a coupling effect between adjacent word lines is increased.

Whenever data is inputted into or outputted from a memory cell, the corresponding word line toggles between an enabled state and a disabled state. As described above, as the coupling effect between adjacent word lines is increased, a phenomenon occurs in which data of memory cells coupled to a word line adjacent to a word line that is frequently enabled is damaged. This phenomenon is called "row hammering", which is problematic in that data of a memory cell is damaged by disturbance of the word line before the memory cell is refreshed.

FIG. 1 is a diagram illustrating a portion of a cell array in a memory device to describe a row hammering phenomenon.

In FIG. 1, 'WLL' denotes a word line that has been enabled a large number of times, and 'WLL−1' and 'WLL+1' respectively denote word lines disposed adjacent to 'WLL'. In other words, 'WLL−1' and 'WLL+1' denote word lines disposed adjacent to the word line that has been enabled a large number of times. 'CL' denotes a memory cell coupled to 'WLL', 'CL−1' denotes a memory cell coupled to 'WLL−1', and 'CL+1' denotes a memory cell coupled to 'WLL+1'. Each of the memory cells includes a cell transistor TL, TL−1, TL+1 and a cell capacitor CAPL, CAPL−1, CAPL+1.

When 'WLL' is enabled or disabled, the voltages of 'WLL−1' and 'WLL+1' are increased or decreased by a coupling phenomenon caused between 'WLL', 'WLL−1' and 'WLL+1', thus affecting the amount of electric charge of the cell capacitors CAPL−1 and CAPL+1. Therefore, if 'WLL' is frequently enabled and thus toggles between the enabled state and the disabled state, a change in the amount of charge stored in the cell capacitors CAPL−1 and CAPL+1 in the memory cells 'CL−1' and 'CL+1' is increased. Thereby, data in these memory cells may deteriorate.

Furthermore, electromagnetic waves generated when the word line toggles between the enabled state and the disabled state cause inflow or outflow of electrons into or from cell capacitors of memory cells coupled to adjacent word lines, thus causing damage to the data.

As a method for solving the row hammering phenomenon, a method of finding a row (i.e., a word line) that has been enabled several times and refreshing rows adjacent to the several-times-enabled row is mainly used. As a method of finding a row that has been enabled several times, a method of counting the number of times each row is enabled for a predetermined time is mainly used. However, in this case, overhead is excessively increased.

SUMMARY

Various embodiments are directed to a memory system and an operation method for the memory system.

In an embodiment, a memory system may include a memory device including a table suitable for managing rows for an additional refresh operation; and a memory controller comprising: a replica table corresponding to the table of the memory; an error history storage circuit suitable for storing an error history of the memory device; and a determination circuit suitable for determining whether to perform an active operation of a target row to be evicted from the replica table without the additional refresh operation, using the error history, when the target row is present.

In another embodiment, an operation method of a memory system may comprise: managing, by a memory device, a table for storing rows for an additional refresh operation; managing, by a memory controller, a replica table corresponding to the table; selecting, by the memory controller, a row to be evicted from the replica table without the additional refresh operation, and evicting the selected row; checking, by the memory controller, whether an error history of the selected row is present; and determining, by the memory controller, to perform an active operation for the selected row in response to the checking operation indicating the presence of the error history of the selected row.

In still another embodiment, a memory system may include a memory device including a cell array having cells coupled to a plurality of rows and a table for storing target rows for an additional refresh operation among the plurality of rows; and a controller including: a selecting circuit including a replica table, which is a replica of the table, and suitable for selecting the target rows among the plurality of rows, storing information on the target rows in the replica table and determining at least one row to be evicted (eviction row) from the table, among the target rows; an error history storage circuit suitable for storing an error history on each of the plurality of rows; and a determination circuit suitable for determining to perform an active operation on the eviction row when the eviction row has an error history.

DETAILED DESCRIPTION

Figure 1:
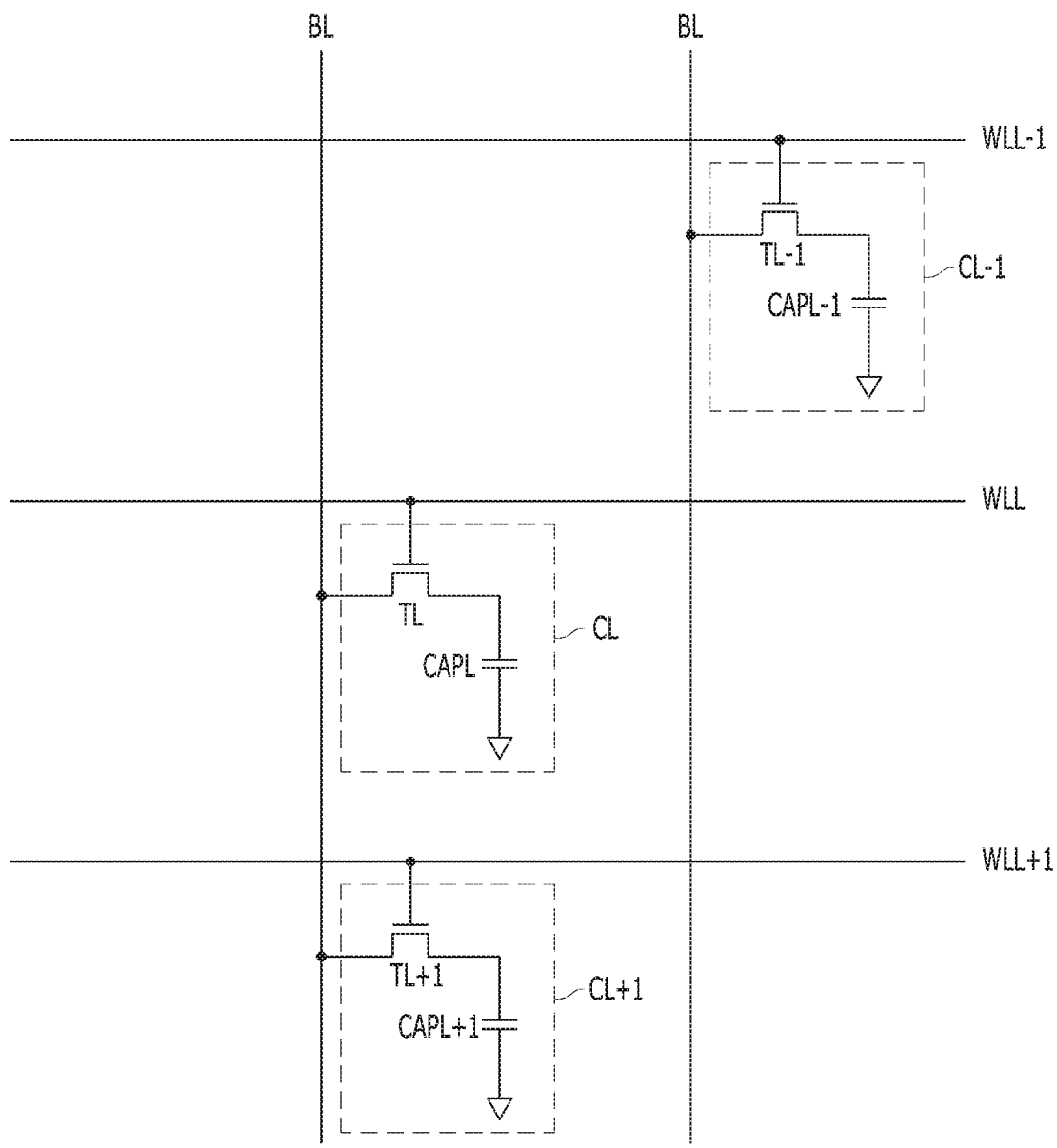
FIG. 1 is a diagram illustrating a portion of a cell array included in a memory device to describe a row hammering phenomenon.

Various embodiments are described below in more detail with reference to the accompanying drawings. The present invention may, however, be embodied in different forms and should not be construed as limited to the embodiments set forth herein. Rather, these embodiments are provided so that this disclosure is thorough and complete and fully conveys the scope of the present invention to those skilled in the art. Throughout the disclosure, like reference numerals refer to like parts throughout the various figures and embodiments of the present invention. Throughout the specification, reference to "an embodiment," "another embodiment" or the like is not necessarily to only one embodiment, and different references to any such phrase are not necessarily to the same embodiment(s).

As used herein, singular forms may include the plural forms as well and vice versa, unless the context clearly indicates otherwise. The articles 'a' and 'an' as used in this application and the appended claims should generally be construed to mean 'one or more' unless specified otherwise or clear from context to be directed to a singular form.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present. Communication between two elements, whether directly or indirectly connected/coupled, may be wired or wireless, unless stated or the context indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

No term used in the claims herein is intended to invoke interpretation under 35 U.S.C. § 112(f), unless "means for" or "step for" is used in connection with a particular term. As used in the present specification and claims, the terms 'circuit', 'component', 'module' and the like refer to hardware or a combination of hardware and software/firmware. As a further example, as used in this application, any of the above terms may also cover an implementation of merely a processor (or multiple processors) or portion of a processor and its (or their) accompanying software and/or firmware.

Hereinafter, the various embodiments of the present invention will be described in detail with reference to the attached drawings.

Figure 2:
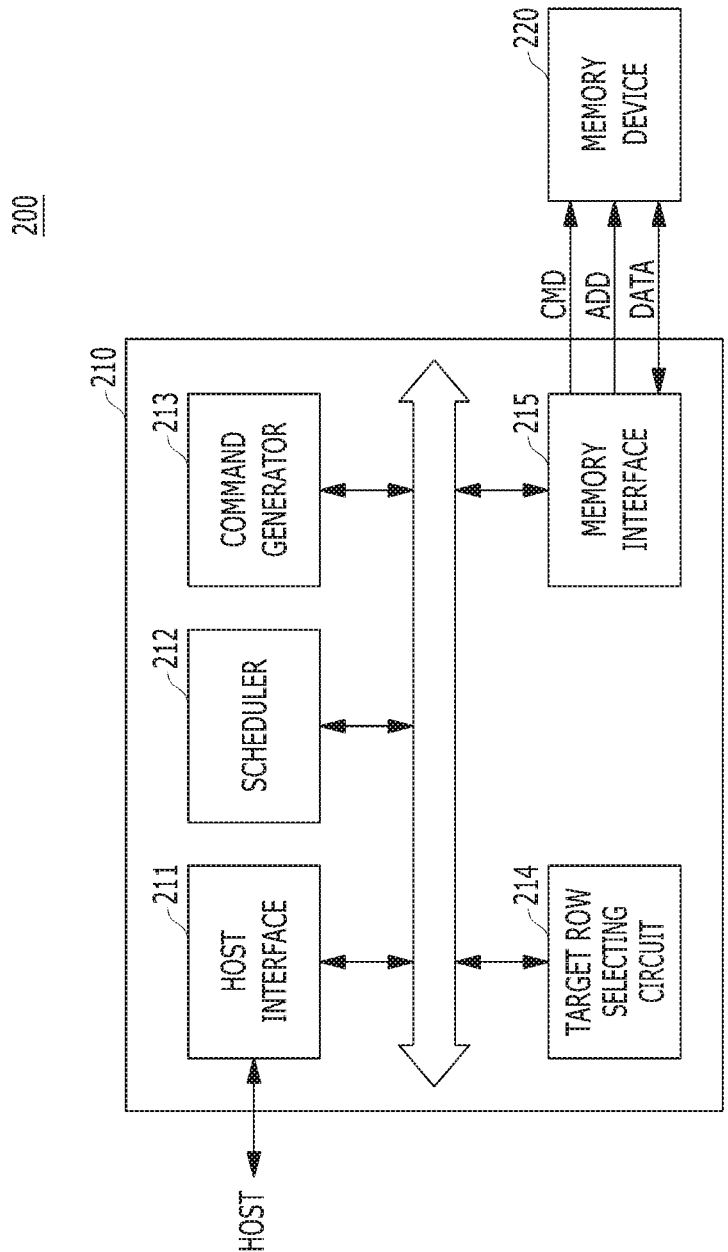
FIG. 2 is a diagram illustrating a memory system in accordance with an embodiment.

FIG. 2 is a diagram illustrating a memory system 200 in accordance with an embodiment.

Referring to FIG. 2, the memory system 200 may include a memory controller 210 and a memory device 220.

The memory controller 210 may control an operation of operation of the memory device 220 in response to a request from a host (HOST). Examples of suitable host devices include a central processing unit (CPU), a graphic processing unit (GPU), and an application processor (AP). The memory controller 210 may include a host interface 211, a scheduler 212, a command generator 213, a target row selecting circuit 214, and a memory interface 215. The target row selecting circuit 214 may select a row (or a word line) to be refreshed.

The host interface 211 may provide an interface between the memory controller 210 and the host. Requests of the host may be received through the host interface 211. Results of processing the requests may be transmitted to the host through the host interface 211.

The scheduler 212 may determine, among a plurality of requests received from the host, a sequence of requests to be applied to the memory device 220. The scheduler 212 may select the sequence for enhancing the performance of the memory device 220 and the memory system 200. The scheduler 212 determines the sequence according to which the operations corresponding to the received requests differ from the sequence of the requests received from the host. Hence, the scheduler 212 may determine a sequence of operations to be provided as instructions to the memory device 220 that differs from the sequence in which corresponding requests were received by the memory controller 210 so that the performance of the memory device 220 may be enhanced. For example, even if the host requests a read operation of the memory device 220 before requesting a write operation of the memory device 220, the sequence of requests may be adjusted such that the write operation is performed earlier than the read operation in order to optimize the operation of the memory device 220.

The scheduler 212 may schedule refresh operations to be performed during intervals of the operations requested from the host so as to prevent data of the memory device 220 from being lost. Each time a refresh command is applied from the memory controller 210 to the memory device 220 by scheduling of the scheduler 212, the memory device 220 may sequentially enable internal rows (i.e., word lines).

The scheduler 212 may schedule not only a general refresh operation but also an additional refresh operation for preventing data being lost by row hammering. The additional refresh operation may be performed by enabling a row having a high possibility of data loss attributable to the row hammering to be refreshed earlier, rather than sequentially refreshing the rows of the memory device 220. That is, during the additional refresh operation, an active command and an address of a row having a high possibility of data loss due to the row hammering may be applied from the memory controller 210 to the memory device 220. The row having a high possibility of data loss due to the row hammering may be selected by the target row selecting circuit 214. In an embodiment, the scheduler 212 may periodically schedule the additional refresh operation. For example, the additional refresh operation may be performed once each time the refresh operation is performed ten times. Alternatively, the additional refresh operation may be performed once each time the refresh operation is performed a hundred times.

The target row selecting circuit 214 may monitor an active command and an address to be applied from the memory controller 210 to the memory device 220. Further, the target row selecting circuit 214 may select a row having a high possibility of data loss due to row hammering, and provide information of the selected row to the scheduler 212. Thus, an additional refresh operation on the row having a high possibility of data loss due to row hammering may be performed.

The command generator 213 may generate a command to be applied to the memory device 220 according to the sequence of operations determined by the scheduler 212.

The memory interface 215 may provide an interface between the memory controller 210 and the memory device 220. A command CMD and an address ADD may be transmitted from the memory controller 210 to the memory device 220 through the memory interface 215, and data DATA may be exchanged therebetween through the memory interface 215. The memory interface 215 may also be called a physical (PHY) interface.

The memory device 220 may perform an operation instructed by the memory controller 210. The memory device 220 may be of a type that needs a refresh operation. For example, the memory device 220 may be a dynamic random access memory (DRAM) or may be another kind of memory device that requires a refresh operation.

Figure 3:
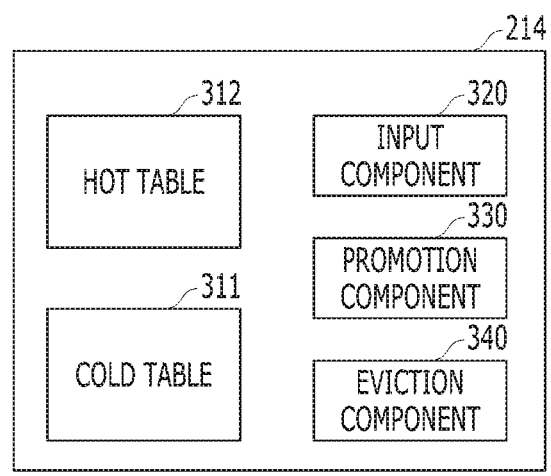
FIG. 3 is a diagram illustrating a target row selecting circuit in accordance with an embodiment.

FIG. 3 is a diagram illustrating the target row selecting circuit 214 in accordance with an embodiment.

Referring to FIG. 3, the target row selecting circuit 214 may include a cold table 311, a hot table 312, an input component 320, a promotion component 330, and an eviction component 340.

The cold table 311 may store a plurality of cold rows. The cold rows may refer to rows that have been stored neither in the cold table 311 nor the hot table 312 among rows selected as hammered rows. Ranks may be applied to the cold rows stored in the cold table 311.

The hot table 312 may store a plurality of hot rows. The hot rows may refer to rows that have been stored in the cold table 311 or the hot table 312 among the rows selected as the hammered rows. Ranks may be applied to the hot rows stored in the hot table 312. During an additional refresh operation, one of the hot rows may be refreshed. With regard to this, one of two methods may be used. In accordance with a first method (1), during the additional refresh operation, a hot row of a highest rank of the hot table 312, i.e., a hot row of rank 0, may be an additional refresh target. If the highest rank of the hot table 312 is empty, in other words, if rank 0 is empty, the additional refresh operation may not be performed. In accordance with a second method (2), during the additional refresh operation, a hot row of a highest rank among the hot rows of the hot table 312 may be an additional refresh target. For instance, if rank 0 is empty and a hot row of rank 1 is present, an additional refresh operation on the hot row of rank 1 may be performed. In the case where there is no hot row in the hot table 312, an additional refresh operation may not be performed.

The input component 320 may select a hammered row and insert information of the selected hammered row into the cold table 311. One of two methods may be used as a method of selecting the hammered row by the input component 320. In accordance with one method (A), the input component 320 may select all rows adjacent to an enabled row as hammered rows. For example, if row 3 is enabled, row 2 may be selected as a hammered row, and row 4 may be selected as a hammered row. In accordance with another method (B), the input component 320 may select, as hammered rows, only rows randomly selected from among rows adjacent to an enabled row. For example, among the rows adjacent to the enabled row, only a row selected with a probability of 10% may be selected as a hammered row. In detail, when row 3 is enabled, if row 3 is selected with the probability of 10%, row 2 and row 4 that are adjacent to row 3 may be selected as hammered rows. If row 3 is not selected with the probability of 10%, row 2 and row 4 may not be selected as hammered rows. Here, the operation of selecting enabled row 3 with the probability of 10% may be performed, e.g., by a method in which a random number of numbers from 1 to 100 is generated by a random number generator. In accordance with such method, if the generated random number is within a range from 1 to 10, it is determined that row 3 has been selected with the probability of 10%, and if not, it is determined that row 3 has been unselected with the probability of 10%. The phenomenon of data loss due to the row hammering occurs when a certain row is enabled one thousand or more times for a short period of time. Therefore, even if only 10% of rows adjacent to the enabled row are selected as hammered rows, there is no concern with determining a row having a probability of data loss. Compared to the case of method (A), where all of the rows adjacent to the enabled rows are selected as hammered rows, in the case of method (B), where rows adjacent to a row randomly selected from among the enabled rows are selected as hammered rows, the sizes of the cold table and the hot table may be reduced.

In the case where a selected hammered row is a row that is stored neither in the cold table 311 nor in the hot table 312, the input component 320 may store the selected hammered row as a cold row in a highest rank, i.e., rank 0, of the cold table 311. In this case, the rank of each of the cold rows that have been already stored in the cold table 311 may be lowered by one level.

In the case where a hammered row selected by the input component 320 is one of cold rows that have been stored in the cold table 311, the promotion component 330 may remove the corresponding row from the cold table 311 and promote it as a hot row of a lowest rank of the hot table 312. In this case, an existing hot row that has been in the lowest rank of the hot table 312 may be transmitted to the highest rank of the cold table 311.

In the case where a hammered row selected by the input component 320 is one of the hot rows that have been stored in the hot table 312, the promotion component 330 may increase the rank of the corresponding hot row by one level. As the rank of the hot row is increased by one level, the rank of a hot row that has been in a one-level higher rank may be lowered by one level. For example, if a hot row of rank 2 is increased to rank 1, an existing hot row of rank 1 may be lowered to rank 2.

The eviction component 340 may remove (or evict), among the hot rows of the hot table 312, a hot row, on which the additional refresh operation has been performed, from the hot table 312. In the case where a new cold row is stored in the cold table 311, the eviction component 340 may remove one of the cold rows from the cold table 311 if the cold table 311 is in a full state. As a method of removing one of the cold rows from the cold table 311 by the eviction component 340, one of two methods may be used. In accordance with one method (I), when a new cold row is stored in the cold table 311, the eviction component 340 may remove a cold row of the lowest rank from the cold table 311 if the cold table 311 is in a full state. In accordance with another method (II), when a new cold row is stored in the cold table 311, the eviction component 340 may remove one cold row based on eviction probabilities given by ranks of cold rows. For example, in the case where four cold rows having ranks 0 to 3 are present in the cold table 311, eviction probabilities of 10%, 20%, 20%, and 50% may be respectively given thereto, and one cold row selected based on these eviction probabilities may be removed. In some embodiments, the operation of selecting one cold row based on the eviction probabilities may be performed by a method including: generating a random number of numbers from 1 to 100; removing a cold row of rank 0 if the generated random number ranges from 1 to 10 corresponding to the eviction probability of 10%; removing a cold row of rank 1 if the generated random number ranges from 11 to 30 corresponding to the eviction probability of 20%; removing a cold row of rank 2 if the generated random number ranges from 31 to 50 corresponding to the eviction probability of 20%; and removing a cold row of rank 3 if the generated random number ranges from 51 to 100 corresponding to the eviction probability of 50%. The use of a method such as method (II) by the eviction component 340 is to give slight unexpectedness to the method of selecting a row to be refreshed.

The target row selecting circuit 214 may select a row having a high possibility of data loss due to row hammering, based on a history of an enabled row, using simple configuration and method.

Figure 4:
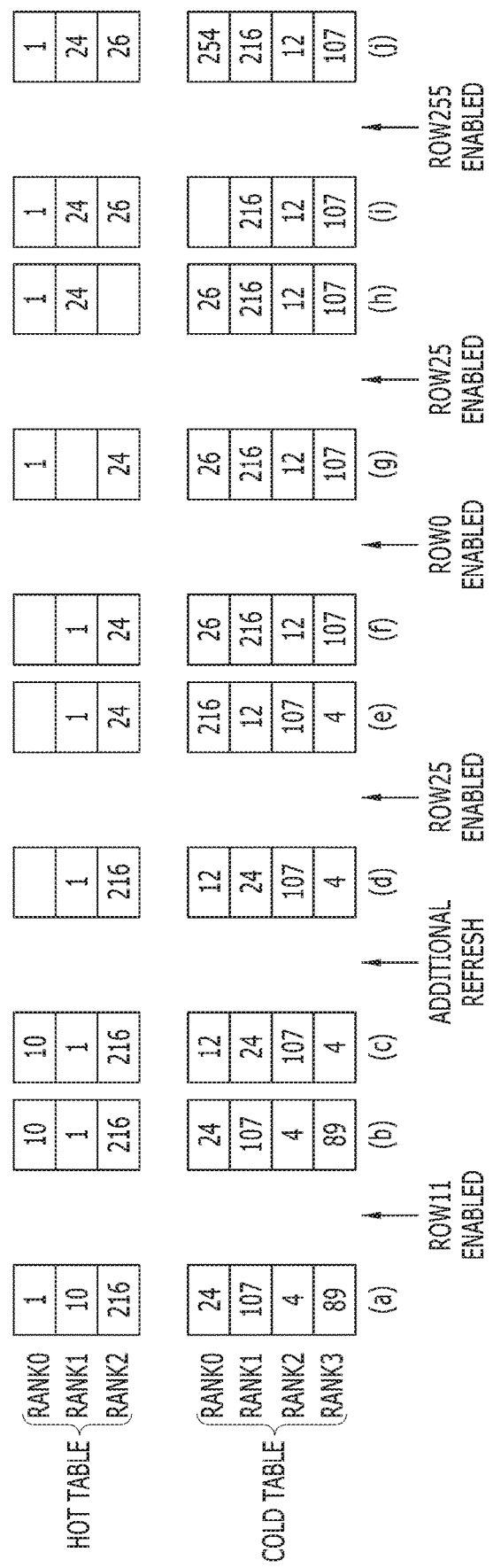
FIG. 4 is a diagram illustrating an operation of a target row selecting circuit in accordance with an embodiment.

FIG. 4 is a diagram illustrating an operation of the target row selecting circuit 214. By way of example, such operation is described in the context in which method (1) is used as a method of refreshing one of hot rows of the hot table 312, method (A) is used as a method of selecting a hammered row by the input component 320, and method (I) is used as a method of removing a cold row by the eviction unit 340. Furthermore, there will be described an example in which the cold table 311 stores four cold rows, and the hot table 312 stores three hot rows. In addition, there will be described an example in which there are 256 rows from row 0 to row 255.

Referring to FIG. 4, in a state in which the hot table 312 and the cold table 311 are stored as shown in (a), row 11 may be enabled. When row 11 is enabled, row 10 and row 12 that are adjacent to row 11 may be selected as hammered rows. Because row 10 is already stored as a hot row in the hot table 312, the rank of row 10 is increased from 1 to 0, so that the hot table 312 and the cold table 311 enter a state of (b). Because row 12 is in a state in which it is stored neither in the hot table 312 nor in the cold table 311, row 12 enters rank 0 that is the highest rank of the cold table 311. Further, row 24, row 107 and row 4 are lowered in rank, and row 89 is removed from the cold table 311. As a result, the hot table 312 and the cold table 311 enter a state of (c).

If an additional refresh operation is performed when the hot table 312 and the cold table 311 are in the state of (c), the additional refresh operation may be performed to row 10 in rank 0 of the hot table 312. In other words, the additional refresh operation may be performed to row 10 in the memory device 220. After the additional refresh operation has been performed, row 10 is removed from the hot table 312, so that the hot table 312 and the cold table 311 may enter a state of (d).

While the hot table 312 and the cold table 311 are in the state of (d), row 25 may be enabled. When row 25 is enabled, row 24 and row 26 that are adjacent to row 25 may be selected as hammered rows. Because row 24 is already stored in the cold table 311, row 24 may be moved to rank 2 that is the lowest rank of the hot table 312. Row 216 that has been in rank 2 of the hot table 312 may be moved to rank 0 of the cold table 311. Thereby, the hot table 312 and the cold table 311 may enter a state of (e). Because row 26 has been present neither in the hot table 312 nor in the cold table 311, row 26 is stored in rank 0 of the cold table 311. As a result, the hot table 312 and the cold table 311 may enter a state of (f).

While the hot table 312 and the cold table 311 are in the state of (f), row 0 may be enabled. When row 0 is enabled, row 1 that is adjacent to row 0 may be selected as a hammered row. Because row 1 is already stored in the hot table 312, the rank of row 1 is increased from 1 to 0, so that the hot table 311 and the cold table 311 enter a state of (g).

While the hot table 312 and the cold table 311 are in the state of (g), row 25 may be enabled. When row 25 is enabled, row 24 and row 26 that are adjacent to row 25 may be selected as hammered rows. Because row 24 is already stored in the hot table 312, the rank of row 24 is increased from 2 to 1, so that the hot table 311 and the cold table 311 may enter a state of (h). Since row 26 is already present in the cold table 311, row 26 is moved to rank 3 of the hot table 312 and removed from the cold table 311. Thus, the hot table 312 and the cold table 311 may enter a state of (i).

While the hot table 312 and the cold table 311 are in the state of (i), row 255 may be enabled. When row 255 is enabled, row 254 that is adjacent to row 255 may be selected as a hammered row. Because row 254 is neither in the hot table 312 nor in the cold table 311, row 254 is stored in rank 0 of the cold table 311. As a result, the hot table 312 and the cold table 311 may enter a state of (j).

As described above in FIG. 4, it may be understood that rows adjacent to a row enabled several times are stored in higher ranks in the hot table 312, and rows adjacent to the enabled row after a long time has passed after it has been enabled are gradually lowered in ranks and eventually removed from the cold table 311.

Figure 5:
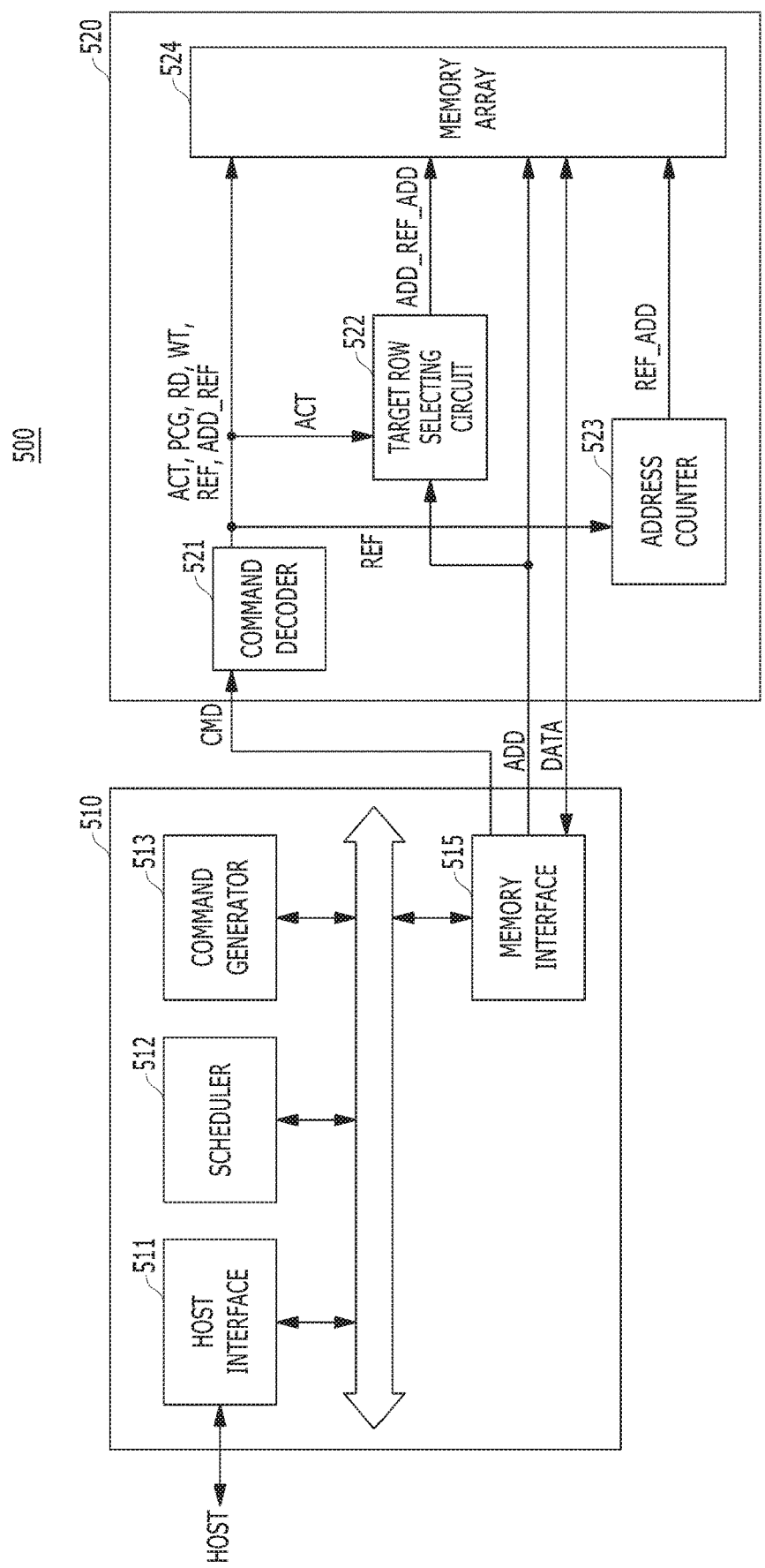
FIG. 5 is a diagram illustrating a memory system in accordance with an embodiment.

FIG. 5 is a diagram illustrating a memory system 500 in accordance with another embodiment.

Referring to FIG. 5, the memory system 500 may include a memory controller 510 and a memory device 520. In the memory system 500 of FIG. 5, a target row selecting circuit 522 for selecting a row to be refreshed may be included in the memory device 520 rather than in the memory controller 510.

The memory controller 510 may control an operation of the memory device 520 in response to a request from a host (HOST). Examples of the host may include a central processing unit (CPU), a graphic processing unit (GPU), and an application processor (AP). The memory controller 510 may include a host interface 511, a scheduler 512, a command generator 513, and a memory interface 515.

The host interface 511 may be provided for interface between the memory controller 510 and the host. Requests of the host may be received through the host interface 511, and results of processing the requests may be transmitted to the host through the host interface 511.

The scheduler 512 may determine, among requests from the host, a sequence of requests to be applied to the memory device 520. The scheduler 512 may make a sequence of requests received from the host and a sequence of operations to be provided as instructions to the memory device 520, which are different from each other, to enhance the performance of the memory device 520. For example, even if the host requests a read operation of the memory device 520 before requesting a write operation of the memory device 520, the sequence of requests may be adjusted such that the write operation is performed earlier than the read operation.

The scheduler 512 may schedule refresh operations in intervals of the operations requested from the host so as to prevent data of the memory device 520 from being lost. Each time a refresh command is applied from the memory controller 510 to the memory device 520 by scheduling of the scheduler 510, the memory device 520 may sequentially enable internal rows (i.e., word lines).

The scheduler 512 may schedule not only a general refresh operation but also an additional refresh operation for preventing data being lost by row hammering. In the embodiment of FIG. 5, since the target row selecting circuit 522 is included in the memory device 520, the memory controller 510 may instruct the memory device 520 to perform the additional refresh operation by applying an additional refresh command to the memory device 520. The scheduler 512 may periodically schedule the additional refresh operation. For example, the additional refresh operation may be performed once each time the refresh operation is performed ten times. Alternatively, the additional refresh operation may be performed once each time the refresh operation is performed a hundred times.

The command generator 513 may generate a command to be applied to the memory device 520 according to the sequence of operations determined by the scheduler 512.

The memory interface 515 may be provided for interface between the memory controller 510 and the memory device 520. A command CMD and an address ADD may be transmitted from the memory controller 510 to the memory device 520 through the memory interface 515, and data DATA may be exchanged therebetween through the memory interface 515. The memory interface 515 may also be called a physical (PHY) interface.

The memory device 520 may perform an operation instructed by the memory controller 510. The memory device 520 may include a command decoder 521, the target row selecting circuit 522, an address counter 523, and a memory array 524.

The command decoder 521 may generate internal command signals ACT, PCG, RD, WT, REF, and ADD_REF by decoding a command CMD received from the memory controller 510. The internal command signals may include an active signal ACT, a precharge signal PCG, a read signal RF, a write signal WT, a refresh signal REF, and an additional refresh signal ADD_REF.

The target row selecting circuit 522 may receive an address ADD and an active signal ACT, which are transmitted to the memory array 524. Further, the target row selecting circuit 522 may select rows adjacent to a row enabled several times, i.e., rows on which an additional refresh operation should be performed. The target row selecting circuit 522 may have the same configuration and operation as those of the target row selecting circuit 214 described with reference to FIGS. 3 and 4. An additional refresh address ADD_REF_ADD to be outputted from the target row selecting circuit 522 is an address indicating a row on which the additional refresh operation should be performed. The additional refresh address ADD_REF_ADD may be an address indicating a row of the highest rank of the hot table 312.

The address counter 523 may change the refresh address REF_ADD whenever the refresh signal REF is enabled. The refresh address REF_ADD may be used during the normal refresh operation rather than during the additional refresh operation.

The memory array 524 may perform operations indicated by the internal command signals ACT, PCG, RD, WT, REF, and ADD_REF. During the additional refresh operation during which the additional refresh signal ADD_REF is enabled, the memory array 524 may perform a refresh operation on a row selected by the additional refresh address ADD_REF_ADD. Furthermore, during the refresh operation during which the refresh signal REF is enabled, the memory array 524 may perform a refresh operation on a row selected by the refresh address REF_ADD. In addition, during an active, read, or write operation of the memory array 524, an address ADD received from the memory controller 510 may be used. The memory array 524 may include elements such as a cell array, a row circuit for enabling and/or disabling rows of the cell array, and a column circuit for inputting data into, and outputting data from, the cell array, to perform operations such as active, precharge, read, write, refresh, and additional refresh operations.

FIG. 2 illustrates the case where the target row selecting circuit 214 is included in the memory controller 210. FIG. 5 illustrates the case where the target row selecting circuit 522 is included in the memory device 520. However, these embodiments are only examples. More generally, the target row selecting circuit may be disposed in another component that is neither in the memory device nor in the memory controller. For example, the target row selecting circuit may be formed of a separate chip and disposed between the memory device and the memory controller.

In various embodiments, rows needed to be refreshed due to a row hammering phenomenon may be efficiently selected.

Figure 6:
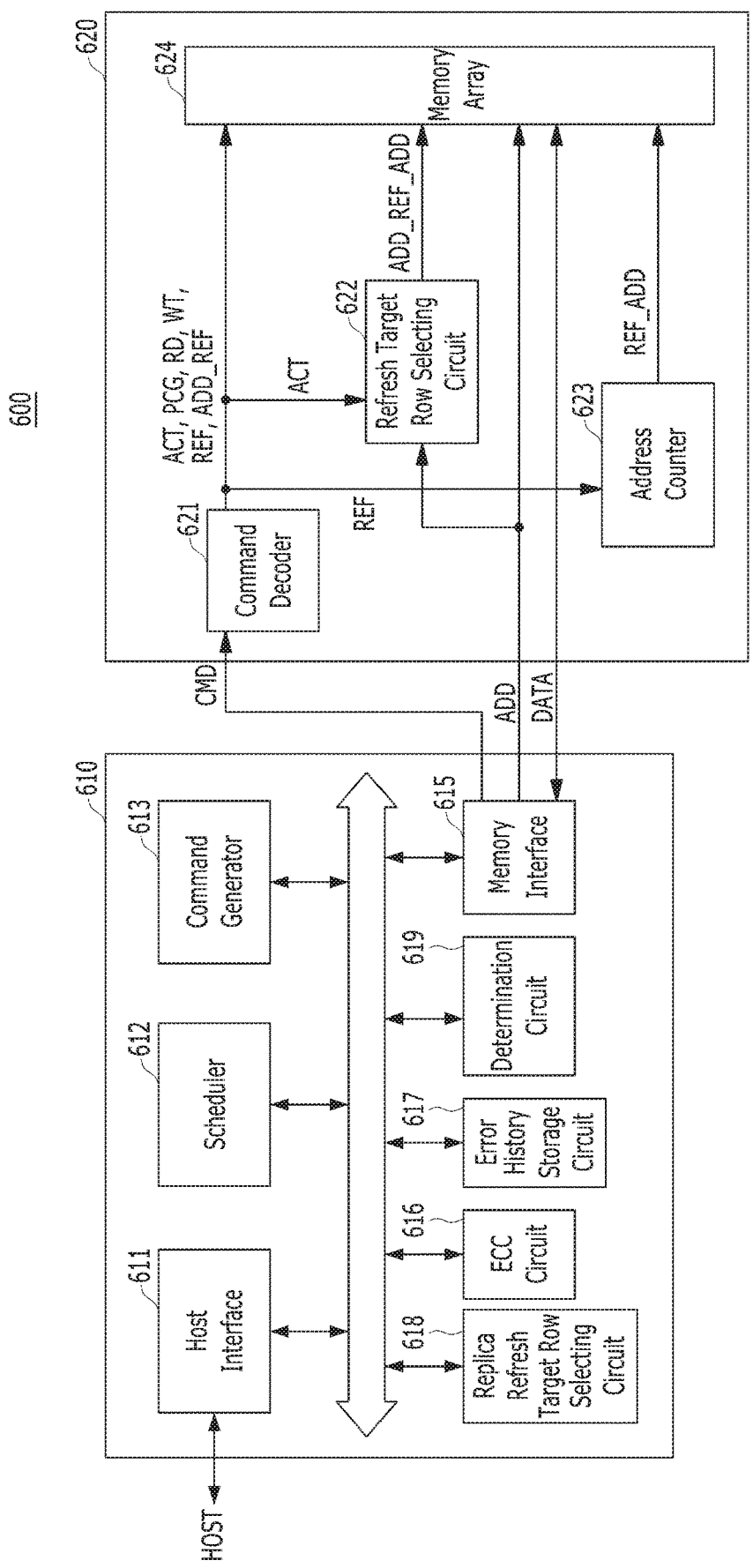
FIG. 6 is a diagram illustrating a memory system in accordance with an embodiment.

FIG. 6 is a diagram illustrating a memory system 600 in accordance with an embodiment.

Referring to FIG. 6, the memory system 600 may include a memory controller 610 and a memory device 620. The memory system 600 may include a refresh target row selecting circuit 622. The refresh target row selecting circuit 622 may be included in the memory device 620, and used to select a row for an additional refresh operation. The memory controller 610 may also include a replica refresh target row selecting circuit 618, which is configured by replicating the refresh target row selecting circuit 622.

The memory device 620 may perform an operation, which is requested by the memory controller 610. The memory device 620 may include a command decoder 621, the refresh target row selecting circuit 622, an address counter 623 and a memory array 624.

The command decoder 621 may generate internal command signals ACT, PCG, RD, WT, REF and ADD_REF by decoding a command CMD received from the memory controller 610. The internal command signals may include an active signal ACT, a precharge signal PCG, a read signal RF, a write signal WT, a refresh signal REF, and an additional refresh signal ADD_REF.

The refresh target row selecting circuit 622 may select a row adjacent to a row which is activated a plurality of times, that is, a row on which an additional refresh operation is to be performed, using the active signal ACT and an address ADD which are transferred to the memory array 624. The refresh target row selecting circuit 622 may be configured and operated in the same manner as the refresh target row selecting circuit 214 described with reference to FIGS. 3 and 4. An additional refresh address ADD_REF_ADD outputted from the refresh target row selecting circuit 622 may include an address indicating the row on which the additional refresh operation is to be performed, that is, an address indicating the row at the highest rank in the hot table 312.

The address counter 623 may change a refresh address REF_ADD whenever the refresh signal REF is enabled. The refresh address REF_ADD generated by the address counter 623 may be used for a normal refresh operation rather than the additional refresh operation.

The memory array 624 may perform an operation ordered by the internal command signals ACT, PCG, RD, WT, REF and ADD_REF. During the additional refresh operation in which the additional refresh signal ADD_REF is enabled, the memory array 624 may perform a refresh operation on the row selected by the additional refresh address ADD_REF_ADD. During a refresh operation in which the refresh signal REF is enabled, the memory array 624 may perform a refresh operation on a row selected by the refresh address REF_ADD. During an active, read or write operation of the memory array 624, the address ADD received from the memory controller 610 may be used. The memory array 624 may include elements for active, precharge, read, write, refresh, and additional refresh operations, for example, a cell array, a row circuit for activating and/or deactivating a row of the cell array, and a column circuit for inputting data to, and outputting data from, the cell array.

The memory controller 610 may control an operation of the memory device 620 according to a request of the host (HOST). The host may include a central processing unit (CPU), a graphic processing unit (GPU), and an application processor (AP). The memory controller 610 may include a host interface 611, a scheduler 612, a command generator 613, a memory interface 615, an error correcting code (ECC) circuit 616, an error history storage circuit 617, the replica refresh target row selecting circuit 618 and a determination circuit 619.

The host interface 611 may serve as an interface between the memory controller 610 and the host. Through the host interface 611, requests of the host may be received and processing results of the requests may be transmitted to the host.

The scheduler 612 may determine a sequence of requests to be applied to the memory device 620, among the requests from the host. The scheduler 612 may schedule operations to be performed by the memory device 620 in a different sequence from the sequence in which the requests are received from the host, in order to enhance the performance of the memory device 620. For example, although the host requested a read operation of the memory device 620 before a write operation, the scheduler 612 may adjust the sequence of the operations such that the write operation is performed before the read operation.

The scheduler 612 may schedule refresh operations between the respective operations requested from the host, in order to prevent a data loss of the memory device 620. Whenever the refresh command is applied to the memory device 620 from the memory controller 610 by the scheduling of the scheduler 612, the memory device 620 may sequentially activate internal rows, i.e. word lines.

The scheduler 612 may schedule not only a general refresh operation but also an additional refresh operation for preventing a data loss by row hammering. In the embodiment of FIG. 6, since the refresh target row selecting circuit 622 for selecting a row on which the additional refresh operation is to be performed is included in the memory device 620, the memory controller 610 may instruct the memory device 620 to perform the additional refresh operation by applying the additional refresh command to the memory device 620. The scheduler 612 may periodically schedule the additional refresh operation. For example, the additional refresh operation may be performed once whenever the refresh operation is performed ten times or 100 times.

The command generator 613 may generate a command to be applied to the memory device 620 according to the sequence of the operations scheduled by the scheduler 612.

The memory interface 615 may serve as an interface between the memory controller 610 and the memory device 620. Through the memory interface 615, a command CMD and an address ADD may be transferred from the memory controller 610 to the memory device 620, and data DATA may be exchanged between the memory controller 610 and the memory device 620. The memory interface 615 may also be referred to as a physical (PHY) interface.

The ECC circuit 616 may generate an error correcting code using data during a write operation. During the write operation, the error correcting code may be transferred and stored into the memory device 620 with the data. In FIG. 6, data DATA may indicate data in which raw data and the error correcting data are combined. During a read operation, the ECC circuit 616 may correct an error of data read from the memory device 620 using the error correcting code read from the memory device 620.

The error history storage circuit 617 may store an error history in which errors have been found or corrected by the ECC circuit 616. For example, the error history storage circuit 617 may store, as the error history, information on rows in which errors have been found.

The replica refresh target row selecting circuit 618 may be configured by replicating the refresh target row selecting circuit 622, and configured and operated in the same manner as the refresh target row selecting circuit 622.

Figure 7:
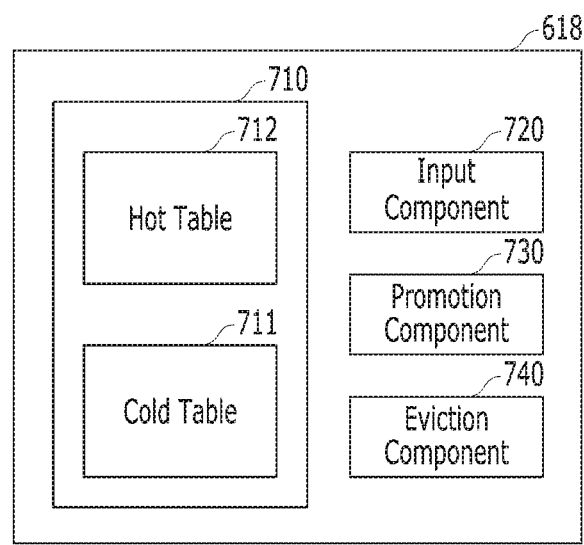
FIG. 7 illustrates a replica refresh target row selecting circuit in accordance with an embodiment.

FIG. 7 illustrates the replica refresh target row selecting circuit 618. Referring to FIG. 7, the replica refresh target row selecting circuit 618 may include a replica table 710, an input component 720, a promotion component 730 and an eviction component 740. The replica table 710 may include a cold table 711 and a hot table 712 like the table of the refresh target row selecting circuit 622. The input component 720, the promotion component 730 and the eviction component 740 of the replica refresh target row selecting circuit 618 may be operated in the same manner as the input component 320, the promotion component 330 and the eviction component 340 of the refresh target row selecting circuit 622. Therefore, the replica table 710 may be managed in the same manner as the table of the refresh target row selecting circuit 622, i.e., the cold table 311 and the hot table 312.

When a row is to be deleted (or evicted) from the replica table 710 without an additional refresh operation, for example, when a row is to be deleted from the cold table 711, the determination circuit 619 may check whether an error history of the row to be evicted is present in the error history storage circuit 617. For example, when a fourth row is to be deleted (or evicted) from the replica table 710 without an additional refresh operation, the determination circuit 619 may check whether an error history for the fourth row is present in the error history storage circuit 617. When the error history of the row to be evicted is present, the determination circuit 619 may notify the error history to the scheduler 612 such that an active operation for the row to be evicted (for example, fourth row) can be performed. Then, the scheduler 612 may schedule the active operation for the row to be evicted. When the error history of the row to be evicted is not present, the active operation for the row to be evicted may not be scheduled.

Now, the operation of the memory system 600 will be described.

First, the refresh target row selecting circuit 622 of the memory device 620 may manage rows that require the additional refresh operation. For example, a row which is determined to require an additional refresh operation by the refresh target row selecting circuit 622 may be a row at the highest rank in the hot table 312. The row for the additional refresh operation may be deleted from the hot table 312 while an additional refresh operation is performed on the corresponding row. For example, a row which is determined to not require an additional refresh operation by the refresh target row selecting circuit 622 may be a row at the lowest rank in the cold table 311. The row not requiring an additional refresh operation may be deleted from the cold table 311 without an additional refresh operation for the corresponding row.

The replica refresh target row selecting circuit 618 of the memory controller 610 may manage the replica table 710 in the same manner as the table of the refresh target row selecting circuit 622 of the memory device 620. For example, when the refresh target row selecting circuit 622 deletes a 45th row from the hot table 312, on which an additional refresh operation is performed, the replica refresh target row selecting circuit 618 may also delete the 45th row from the hot table 712 of the replica table 710. For example, when the refresh target row selecting circuit 622 deletes a fourth row from the cold table 311, the replica refresh target row selecting circuit 618 may also delete the fourth row from the cold table 711 of the replica table 710.

When a row is to be deleted from the replica table 710 without an additional refresh operation, for example, the fourth row is deleted, the replica refresh target row selecting circuit 618 may notify the occurrence of the row to the determination circuit 619. The determination circuit 619 may check whether an error history for the row deleted from the replica table 710 without an additional refresh operation, for example, the fourth row, is present, using the error history storage circuit 617.

When the error history for the fourth row is not present, the determination circuit 619 may determine that it is safe to delete the fourth row from the replica table 710 without an additional refresh operation for the fourth row.

When the error history for the fourth row is present, the determination circuit 619 may determine that it is not safe to delete the fourth row from the replica table 710 without an additional refresh operation for the fourth row. That is, although the additional refresh operation for the fourth row is required, the replica refresh target row selecting circuit 618 and the refresh target row selecting circuit 622 may mistake the situation and determine that the fourth row is deleted without the additional refresh operation for the fourth row. Therefore, the determination circuit 619 may notify the situation to the scheduler 612, and the scheduler 612 may schedule an active operation for the fourth row. When the active operation for the fourth row is scheduled by the scheduler 612, an address corresponding to the fourth row with an active command may be transferred to the memory device 620 from the memory controller 610, and the fourth row may be activated in the memory device 620. Since the active operation has the same effect as the refresh operation, the same effect as the additional refresh operation for the fourth row may be acquired.

In the memory system 600 of FIG. 6, the memory controller 610 may monitor whether there is a row which the refresh target row selecting circuit 622 of the memory device 620 determines to delete from the table without an additional refresh operation, using the replica refresh target row selecting circuit 618. Furthermore, the memory controller 610 may verify the row to be deleted from the table without an additional refresh operation, using the error history storage circuit 617 and the determination circuit 619. When it is determined that it is not safe to delete the corresponding row, the memory controller 610 may remove the risk by scheduling an active operation for the corresponding row.

In the memory system 600 of FIG. 6, it has been described that an additional refresh operation of the memory device 620 is scheduled by the memory controller 610. That is, when an instruction of the memory controller 610 is provided, the memory device 620 may perform the additional refresh operation. Alternatively, the memory device 620 may autonomously perform an additional refresh operation without an instruction of the memory controller 610. For example, the memory device 620 may perform a hidden additional refresh operation for an extra time, such that the memory controller 610 cannot know the execution of the operation. In this case, since the replica refresh target row selecting circuit 618 of the memory controller 610 cannot know the execution of the additional refresh operation, the memory device 620 may notify the memory controller 610 that the additional refresh operation was performed. When the memory controller 610 is notified that the additional refresh operation was executed, the row at the highest rank in the hot table 712 of the replica refresh target row selecting circuit 618 may be deleted.

Although various embodiments have been illustrated and described, it will be apparent to those skilled in the art in light of the present disclosure that various changes and modifications may be made without departing from the spirit and scope of the invention as defined in the following claims.

What is claimed is:

1. A memory system comprising:
    a memory device including a table suitable for managing rows for an additional refresh operation; and
    a memory controller comprising:
    a replica table corresponding to the table of the memory;
    an error history storage circuit suitable for storing an error history of the memory device; and
    a determination circuit suitable for determining whether to perform an active operation of a target row to be evicted from the replica table without the additional refresh operation, using the error history, when the target row is present.

2. The memory system of claim 1, wherein the table stores a plurality of additional refresh candidate rows,
    wherein a row determined to require the additional refresh operation, among the candidate rows, is deleted from the table while the additional refresh operation for the corresponding row is performed, and a row determined to require no additional refresh operation, among the candidate rows, is deleted from the table without the additional refresh operation.

3. The memory system of claim 2, wherein, when the additional refresh operation is performed, the memory device notifies the memory controller of execution of the additional refresh operation.

4. The memory system of claim 3, wherein, when notified of the execution of the additional refresh operation by the memory device, the memory controller deletes the row determined to require the additional refresh operation from the replica table.

5. The memory system of claim 1, wherein, when the determination circuit determines to perform an active operation for the target row, the memory controller transfers, to the memory device, an active command and an address corresponding to the target row.

6. The memory system of claim 1, wherein the table comprises:
    a cold table suitable for storing a row selected as a hammered row as a cold row, when the row selected as the hammered row is not one of cold rows stored in the cold table and hot rows stored in a hot table; and
    the hot table suitable for storing the row selected as the hammered row as a hot row, when the row selected as the hammered row is one of the cold rows stored in the cold table.

7. The memory system of claim 6, wherein, when the row selected as the hammered row is one of the cold rows, the row selected as the hammered row is deleted from the cold table.

8. The memory system of claim 7, wherein ranks are given to the hot rows stored in the hot table, the lowest rank is given to a hot row which is newly stored in the hot table, and the rank of the row selected as the hammered row is promoted when the row selected as the hammered row is one of the hot rows.

9. The memory system of claim 8, wherein ranks are given to the cold rows stored in the cold table, and the highest rank is given to a cold row which is newly stored in the cold table.

10. The memory system of claim 9, wherein, when a new hot row is stored in the hot table, an existing hot row at the lowest rank is stored as a cold row at the highest rank in the cold table, and a cold row corresponding to the new hot row is deleted from the cold table.

11. The memory system of claim 10, wherein, when a new cold row is stored in the cold table, a cold row at the lowest rank in the cold table is deleted without the additional refresh operation in the case that the cold table is full.

12. The memory system of claim 6, wherein a row adjacent to an activated row is selected as the hammered row.

13. The memory system of claim 6, wherein a row adjacent to a row which is selected with a set probability, among activated rows, is selected as the hammered row.

14. An operation method of a memory system, comprising:
   managing, by a memory device, a table for storing rows for an additional refresh operation;
   managing, by a memory controller, a replica table corresponding to the table;
   selecting, by the memory controller, a row to be evicted from the replica table without the additional refresh operation, and evicting the selected row;
   checking, by the memory controller, whether an error history of the selected row is present; and
   determining, by the memory controller, to perform an active operation for the selected row in response to the checking operation indicating the presence of the error history of the selected row.

15. The operation method of claim 14, further comprising:
   selecting, by the memory controller, another row to be evicted from the replica table without the additional refresh operation, and evicting the selected another row;
   checking, by the memory controller, whether an error history of the evicted another row is present; and
   checking, by the memory controller, that an active operation for the evicted another row is not required in response to the checking operation indicating the absence of the error history of the evicted another row.

16. The operation method of claim 14, further comprising:
   notifying, by the memory device, the memory controller of execution of the additional refresh operation, when the additional refresh operation is executed; and
   deleting, by the memory controller, a row determined to require the additional refresh operation from the replica table in response to the notification.

17. A memory system comprising:
   a memory device including a cell array having cells coupled to a plurality of rows and a table for storing target rows for an additional refresh operation among the plurality of rows; and
   a controller including:
      a selecting circuit including a replica table, which is a replica of the table, and suitable for selecting the target rows among the plurality of rows, storing information on the target rows in the replica table and determining at least one row to be evicted (eviction row) from the table, among the target rows;
      an error history storage circuit suitable for storing an error history on each of the plurality of rows; and
      a determination circuit suitable for determining to perform an active operation on the eviction row when the eviction row has an error history.

18. The memory system of claim 17, wherein the determination circuit determines not to perform the active operation on the eviction row when the eviction row does not have the error history, and
the selecting circuit evicts the eviction row from the table.

* * * * *